United States Patent
Linnell

(10) Patent No.: US 8,239,617 B1
(45) Date of Patent: Aug. 7, 2012

(54) ENTERPRISE DATA STORAGE SYSTEM USING MULTI-LEVEL CELL FLASH MEMORY

(75) Inventor: Thomas E. Linnell, Northborough, MA (US)

(73) Assignee: EMC Corporation, Hopkinton, MA (US)

( * ) Notice: Subject to any disclaimer, the term of this patent is extended or adjusted under 35 U.S.C. 154(b) by 251 days.

(21) Appl. No.: 12/705,471

(22) Filed: Feb. 12, 2010

(51) Int. Cl.
*G06F 12/14* (2006.01)

(52) U.S. Cl. .............. 711/103; 711/111; 711/E12.008

(58) Field of Classification Search .............. 711/103, 711/111, E12.008
See application file for complete search history.

(56) References Cited

U.S. PATENT DOCUMENTS

| | | | |
|---|---|---|---|
| 2009/0172286 A1* | 7/2009 | Lasser et al. | 711/127 |
| 2010/0122022 A1* | 5/2010 | Luo et al. | 711/103 |

\* cited by examiner

*Primary Examiner* — Yong Choe
(74) *Attorney, Agent, or Firm* — Krishnendu Gupta; Jason A. Reyes; Richard Sharkansky

(57) ABSTRACT

A system including an enterprise data storage system having a plurality of multi-level cell (MLC) flash devices configured as data storage drives. The enterprise data storage system is operated in such a way and the configuration of the MLC flash devices is such that the enterprise data storage system is able to maintain a performance level comparable to that of an enterprise data storage system utilizing single-level cell (SLC) flash devices.

11 Claims, 8 Drawing Sheets

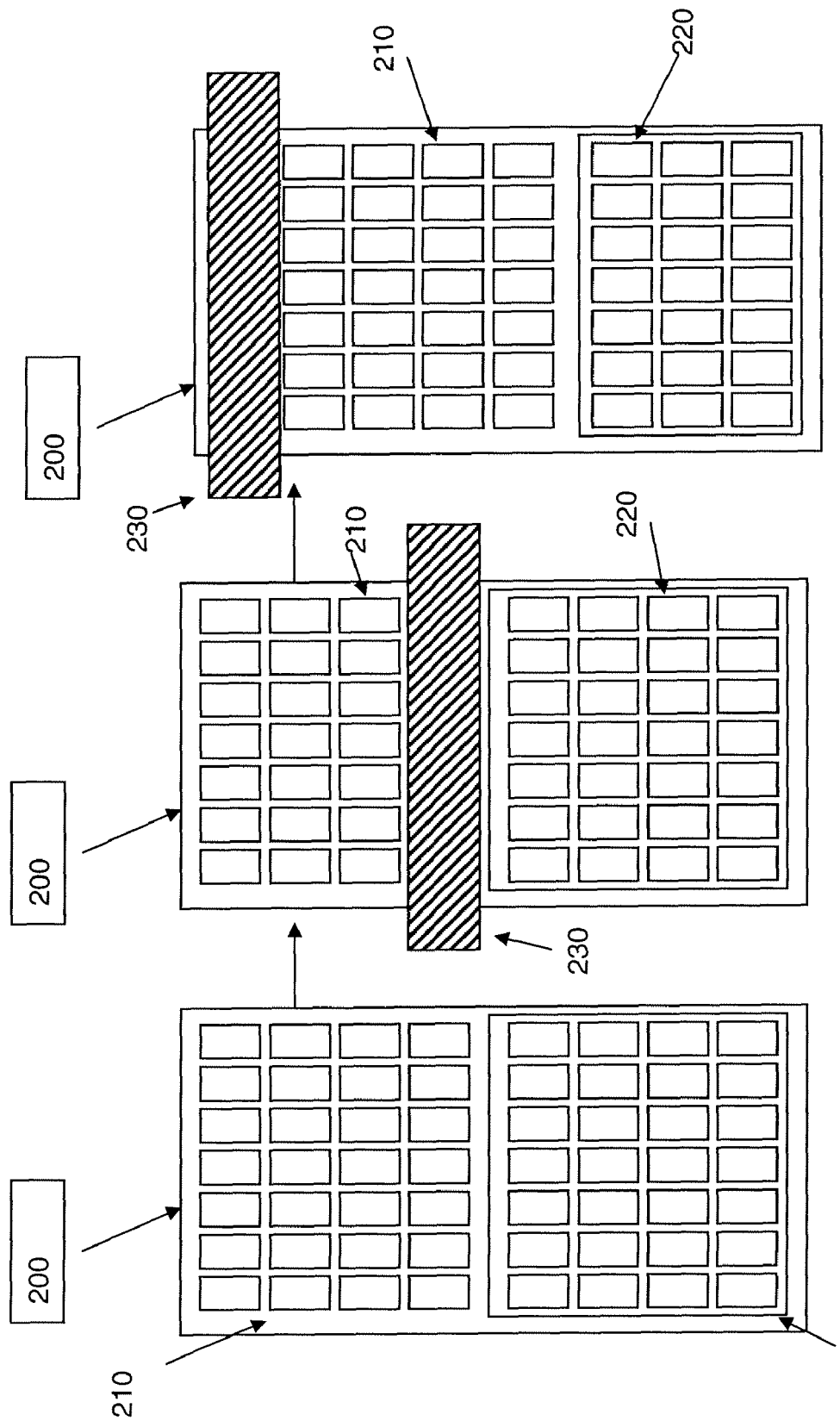

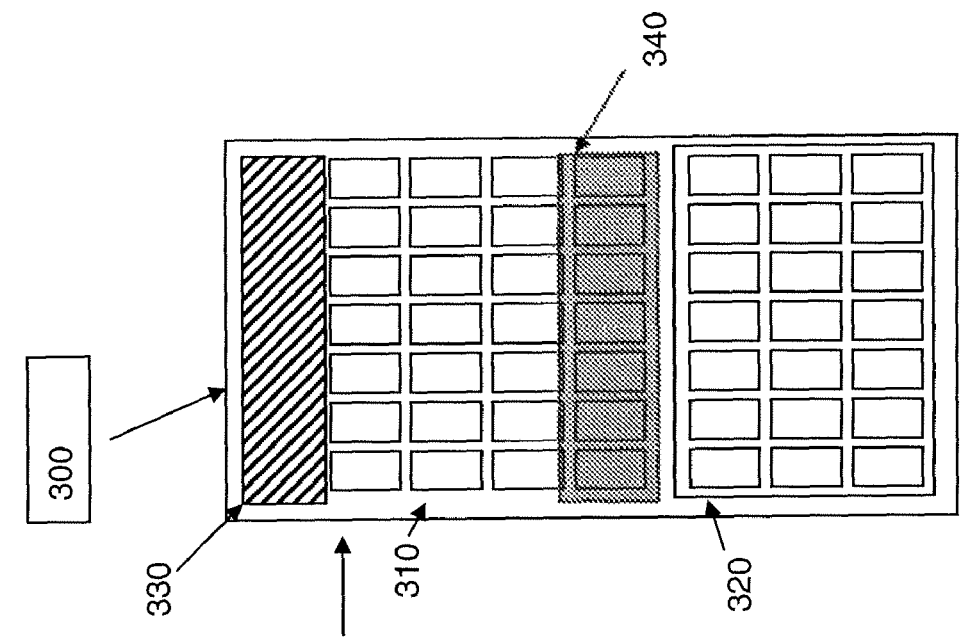
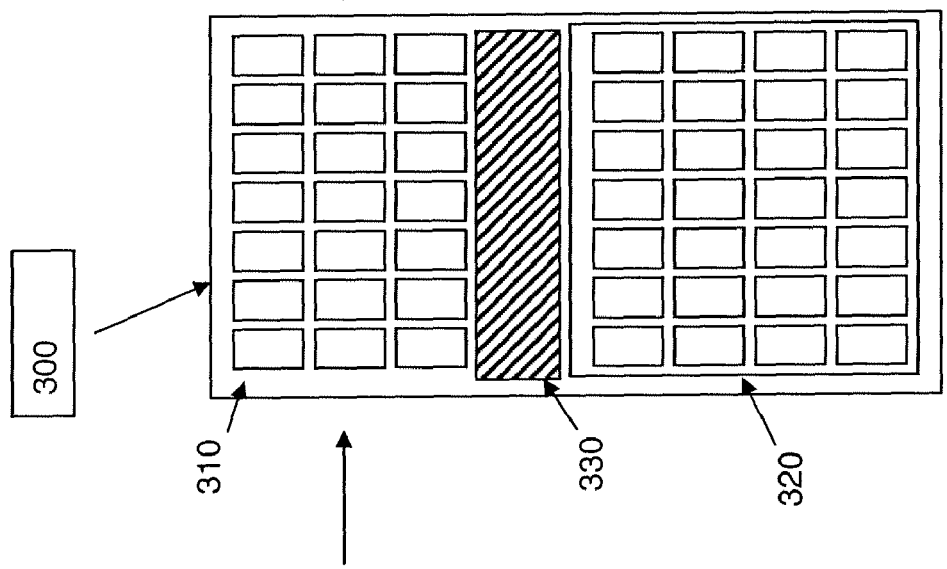
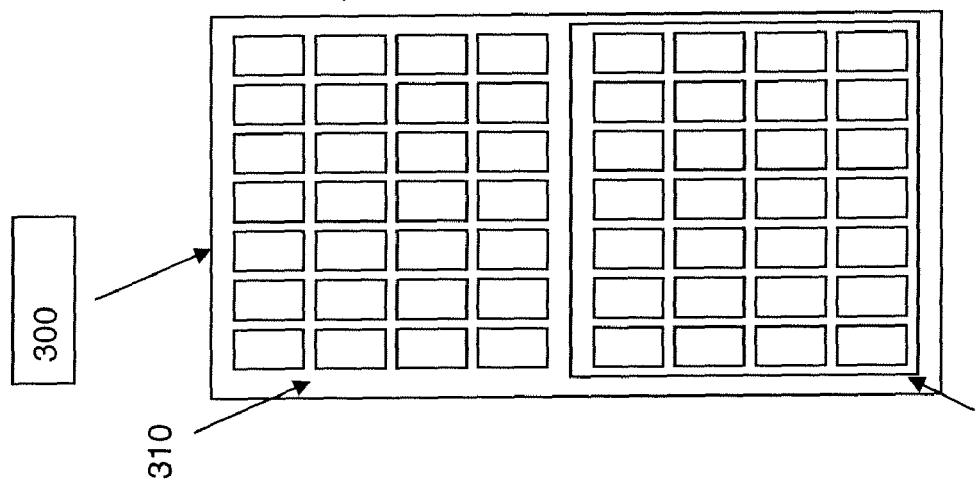

ENTERPRISE DATA STORAGE SYSTEM USING MULTI-LEVEL CELL FLASH MEMORY

RELATED APPLICATION

This application claims the benefit of U.S. Provisional Application No. 61/150,791.

FIELD OF THE INVENTION

A system using low-cost memory devices in an enterprise storage system is disclosed and, more particularly, a data storage system having enterprise-class storage functionality utilizing low-cost flash memory devices.

BACKGROUND

Enterprise storage is computer storage designed for large-scale, high-technology environments. When compared to commercial/consumer storage, it has higher scalability, higher reliability, better fault tolerance, and much higher initial price compared to commercial/consumer storage. Enterprise storage involves the use of a storage area network (SAN), rather than a distributed storage system, and includes benefits such as high availability and disaster recovery, data sharing, and efficient, reliable backup and restoration functions, as well as centralized administration and remote support. Commercial/consumer storage systems are those that are used by consumers or for general commercial use. In general, the requirements of an enterprise storage system, and differences from a consumer type system, can be expressed with respect to four attributes: Performance, Reliability, Durability, and Workload. These four parameters are used to measure the reliability of data storage with respect to workload.

In general, the performance standard for an enterprise storage system needs to be the "best in class" under a given workload. Conversely, a consumer or commercial performance needs only be "good enough" for a particular application. Generally, enterprise storage systems need to maintain a low failure rate, typically under 3%. In comparison, the failure rate for commercial or consumer memory is rarely tracked. With respect to durability, the enterprise system needs to withstand about 5 years of use where a commercial system can be expected to endure 3 years of use. Further, during those working conditions, the enterprise system must be available for 24 hours a day for seven days a week where a commercial system need only be available for 8 hours a day for 5 days a week.

In an effort to increase performance, both enterprise and commercial storage systems have begun to move to a non-volatile memory type called flash memory which can provide higher reliability, lower power consumption and quicker access times than traditional magnetic disk-based storage. The quicker access time, higher reliability, and lower power consumption of flash memory comes at a cost of a limited number of possible writes to the flash memory and hence a limited lifetime, particularly when compared to disk drives.

SUMMARY

There are 2 types of flash memory, single-level cell ("SLC") and multi-level cell ("MLC"). The composition of each type is well-known in the art and therefore will not be described. SLC flash is able to be written to two times faster than MLC flash and has greater write endurance than MLC flash, meaning the number of writes until they fail and are no longer usable for reliable storage functions. For example, SLC flash can be expected to fail after approximately 100,000 writes, whereas MLC flash can be expected to fail after approximately 10,000 writes. However, SLC flash, because of these performance advantages and a number of other factors, is at least twice as expensive as MLC flash and can be as much as ten times more expensive.

Since enterprise storage systems require high-performance data storage devices, and since flash memory has much better overall performance than magnetic disk-based hard drives, flash memory drives, which consist of a number of flash devices configured to perform similar functions as those of magnetic disk drives, are being used in enterprise storage. Because of the performance gap between SLC flash and MCL flash, SLC flash has been used in such enterprise storage systems. While SLC flash is able to meet the performance levels required in an enterprise storage system, e.g., increased performance, reliability, durability, and workload, it's much greater cost is a limiting factor in the amount of SLC flash that can be used.

The present invention comprises an enterprise data storage system which utilizes lower-cost MLC flash while having the performance, reliability, durability and workload abilities of an SLC flash-based enterprise storage system. The SLC flash performance levels have been achieved such through the application of device level, system level, and cross-system level techniques which enable MLC type flash memory to operate in a manner that provides the technological advantages of SLC type memory in the enterprise system. These techniques include, but are not limited to, write avoidance, overprovisioning, write balancing, wear leveling, demand matching, and data aging prediction. Applicants have determined that the application of the aforementioned techniques enables an enterprise storage system utilizing MLC flash to provide the required performance that was formerly only available with the use of the much more expensive SLC flash.

BRIEF DESCRIPTION OF THE DRAWINGS

These and other features will become more readily apparent from the following detailed description when read together with the accompanying drawings, in which:

FIGS. 2A-2C and 3A-3C are further schematic diagrams of a flash drive in accordance with the present invention;

DETAILED DESCRIPTION

An embodiment of the invention is an enterprise data storage system containing MLC flash drives for storage memory. This configuration of MLC flash drives provides the level of performance, reliability and durability necessary for an enterprise storage system, while being less expensive than a comparable system using SLC flash. To enable the MLC flash drives to perform as well as SLC flash in this environment, several techniques are applied to the management and configuration of the MLC drives. These technologies include overprovisioning, write avoidance, write balancing, demand matching, wear balancing and data ageing prediction. Each of these techniques is described in greater detail below.

In different embodiments, configurations are applied to the MLC flash devices at the device level, at the enterprise storage system level, and across storage systems.

Figure 1:
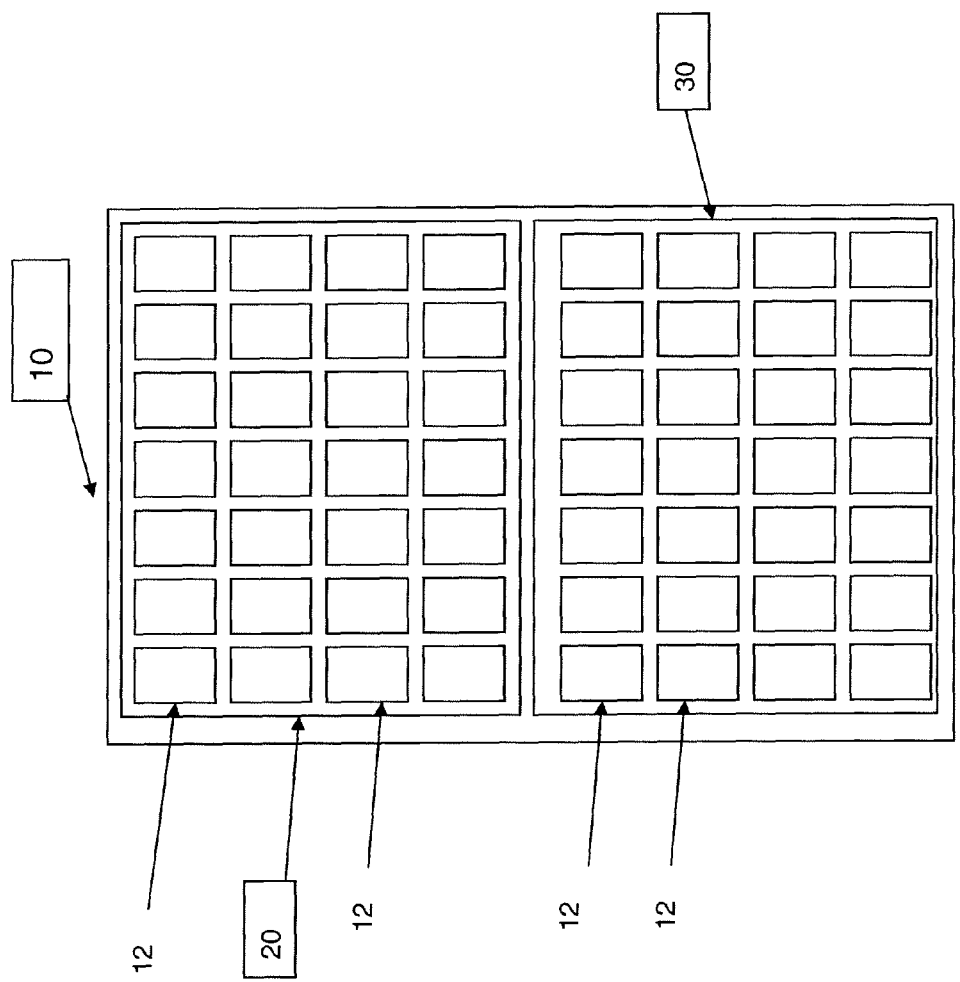
FIG. 1 is a schematic diagram of a flash drive in accordance with the present invention.

A first embodiment of the current technique gives an example of overprovisioning at the device level. As shown in FIG. 1, an MLC flash drive 10 is configured to have an actual storage capacity greater than that of its advertised storage capacity. MLC flash drive 10 contains memory arrays 20 and 30, each array including a number of MLC flash chips 12. Each array 20, 30 has a capacity of, for example, 100 Gb. Memory array 20 is the advertised memory capacity, i.e., the capacity that is shown to the user of the system, and memory arrays 20 and 30 together are the actual memory capacity of the MLC flash drive 10.

In this example, the advertised capacity of MLC flash drive 10 is 100 Gb, i.e., the capacity of array 20, while the drive 10 actually contains 200 Gb of memory. This means that the amount of writes to any MLC flash chip 12 of the MLC drive 10 can be reduced by that percentage of advertised to actual storage. Therefore, in the example of device 10 that advertises a 100 Gb storage capacity but actually has a 200 Gb storage capacity, each write to this drive 10 would be spread out over twice as many flash chips 12. This results in "wear leveling," in which the corresponding wear to each MLC flash chip 12 is half that of a system where the advertised capacity and the actual capacity are the same, as is the case in an SLC flash system. As is explained in further detail below, data written from a host of the system or an application within the system is to the drive 10 by a controller that monitors the number of writes that are directed to each chip 12 to insure that the writes are evenly spread out over each chip 12 in the entire actual storage capacity of the drive 10.

Since each MLC flash chip 12 is exposed to half as many writes, the durability of the flash device 12 is double that of a device in which overprovisioning is not utilized. The ratio of actual capacity to advertised capacity will determine the increase in endurance of each MLC flash chip 12. For example, if array 20 (advertised) is 100 Gb and array 30 is 50 Gb, the ratio of actual to advertised capacity of each chip 12 is 150 Gb/100 Gb=1.5, meaning that each chip will be written to ⅔ of the time compared to a device having a 1:1 ratio of advertised to total capacity. This means an increase in endurance of 1.5 times compared to the 1:1 system. Likewise, in a device 10 where array 20 (advertised) is 100 Gb and array 30 is 200 Gb, the ratio of actual to total capacity of each chip 12 is 300 Gb/100 Gb=3, meaning that each chip will be written to ⅓ of the time compared to a device having a 1:1 ratio of advertised to total capacity. This means an increase in endurance of 3 times compared to the 1:1 system.

Overprovisioning in this manner also enables the write speed of the flash device 10 to be increased. In a drive 10 having a 2:1 ratio of actual to advertised capacity, twice as many writes to the drive 10 can occur in a given time frame, thereby increasing throughput to the drive 10 in a way that approximates the write speed of SLC flash devices.

FIGS. 2A-2C, depict another embodiment, in which flash drive 200 is capable of removing portions of the drive that fail, while still being available to store data. For example, flash drive 200, FIG. 2A, has an actual capacity of 200 Gb between arrays 210 and 220, but an advertised capacity of 100 Gb in array 210. If 25 Gb of this flash drive 200 were to fail, as indicated at 230 of array 210, FIG. 2B, 75 Gb of this device would still be available for storage and the device could still store the advertised 100 Gb by moving 25 Gb of array 220 into array 210 to bring the advertised capacity back to 100 Gb. Conversely, if a magnetic disk drive were in use, a failure of even a portion of the drive usually results in the unavailability of that entire drive. In the example of FIGS. 2A-2C, the portion 230 of the flash device 200 has failed. While, the flash drive reduces its actual capacity, it is still able to store data at its advertised data storage capacity by using the capacity in array 220 to bring the capacity of array 210, which represents the advertised capacity, back to the advertised capacity of 100 Gb. Although the benefits of overprovisioning described above, i.e., increased durability and write speed, are negatively impacted in such a situation, the drive is still able to store data up to its advertised capacity.

In order to maintain a constant actual to advertised capacity ratio, the system may, when the flash drive 300, FIG. 3A, experiences a failure of an amount of memory, such as described with reference to FIGS. 2A-2C, reduce an amount of memory in the drive 300 by a similar amount to the failed memory. In FIG. 3B, a portion 330 of the flash drive 300 has failed, and the system has reduced the actual capacity of flash drive 300 by that amount. In this case, the flash drive 300 may also have its advertised capacity reduced by an amount 340, FIG. 3C, to account for the failed memory indicated at 330, while still maintaining the same advertised to actual storage capacity ratio. In this case, while the advertised and actual memory is reduced, the ratio of advertised memory to actual memory remains the same, as does the speed and durability of the system, as described above.

Figure 8:
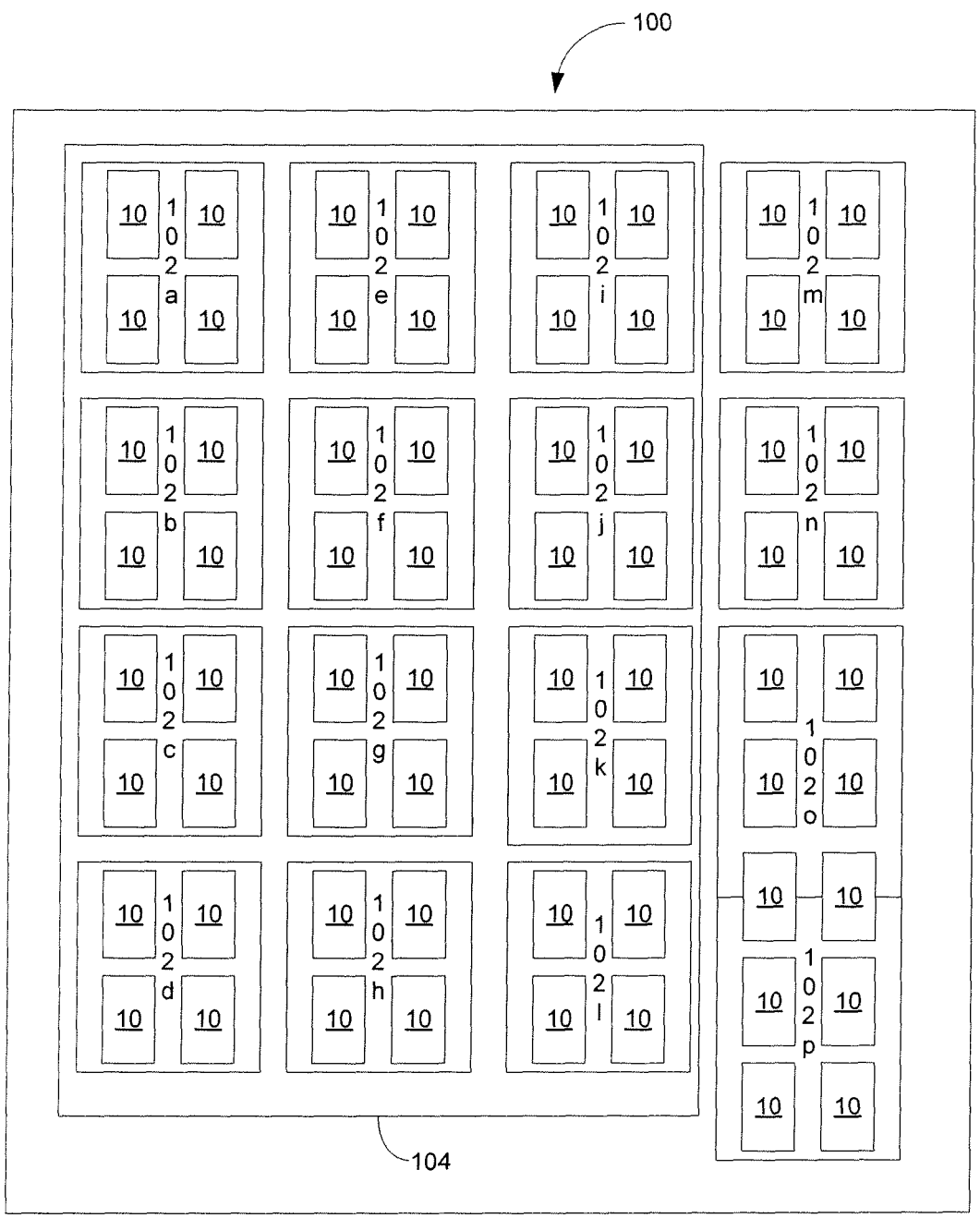
FIG. 8 is a schematic diagram of a data storage drive in accordance with the present invention.

While the embodiment of FIG. 1 involves overprovisioning at the device or drive level, overprovisioning according to the present invention is also done at the system level. Shown in FIG. 8 is a virtual disk 100, which is created from a number of chunks 102a-102p, with each chunk comprising a number of physical flash drives 10. As is known in the art, a virtual disk is a collection of physical disks that the host of the system "sees" as a single disk. It will be understood that a chunk may include any number of physical drives 10, each chunk may include a different number of drives than other chunks in the virtual disk and multiple chunks may include portions of a single physical drive, as shown by chunks 102o and 102p. In this example of the embodiment, while the virtual disk contains 16 chunks, the drive may be advertised as having a capacity of 12 chunks, grouped as 104, including chunks 102a-102l. Therefore, wear leveling, as described above, can be performed at the system level, since writes to the advertised capacity of 12 chunks of the virtual disk 100 can be spread out over the entire actual capacity of 16 chunks. The 0.75 ratio of advertised capacity to actual capacity means that each chunk 102 may be written to ¾ of the time compared to a device having a 1:1 ratio of advertised to total capacity. This means an increase in endurance of 1.33 times compared to the 1:1 system. Likewise, the throughput of writes to the virtual disk 100 is increased by 1.33 times. In this embodiment, the overprovisioning can be controlled at two levels; first by controlling the number of chunks that are allocated to the virtual disk as advertised capacity and actual capacity, as described in this paragraph, and second, by partially allocating the physical drives 10, as described above with reference to FIG. 1.

The techniques described with respect to drives 10 in FIGS. 2 and 3 can also be applied to this embodiment, where, rather than portions of the drive 10 being reprovisioned to address failures within the drive, portions of the virtual disk 100 are reprovisioned, which can occur at the chunk level and the drive level. Further, although not shown, it will be understood that virtual disk 100 may include combinations of MLC flash drives, SLC flash drives and magnetic disk drives, with chunks being provisioned among the various drives.

While the above described the technique of overprovisioning within a drives 10, 200 and 300, and virtual drive 100 the technique can also be applied across several drives. Normally, a RAID group is defined as an N+1 collection of independent storage elements, where the loss of a single element can be tolerated. The RAID group can be overprovisioned with an arbitrary number of extra elements with the express purpose of spreading out the write workload as described above. For example:

Given an N+M RAID group, where the group wholly contains N+M devices, or a part of the devices; and given a set of N+Y devices, or a part of the devices, where Y>M; the writes to the RAID group are then rotated across the Y+M set of devices, where at any one time, Y+M devices are in the active write set, and reads may be serviced from any device that contains a valid copy of the data for the request. The write workload is then reduced by a factor of (N+M)/(N+Y).

This is equivalent to the example above given for the 2:1 overprovisioning case. At the N+Y group level—i.e., in 4+1 RAID, 10 devices are provisioned. Therefore, each device receives half of the writes, and both sets of devices can service reads. Accordingly, the durability of each device is doubled. In one embodiment of this type of overprovisioning, each storage element may be comprised of a virtual disk, such as that described in connection with FIG. 8.

Figure 4:
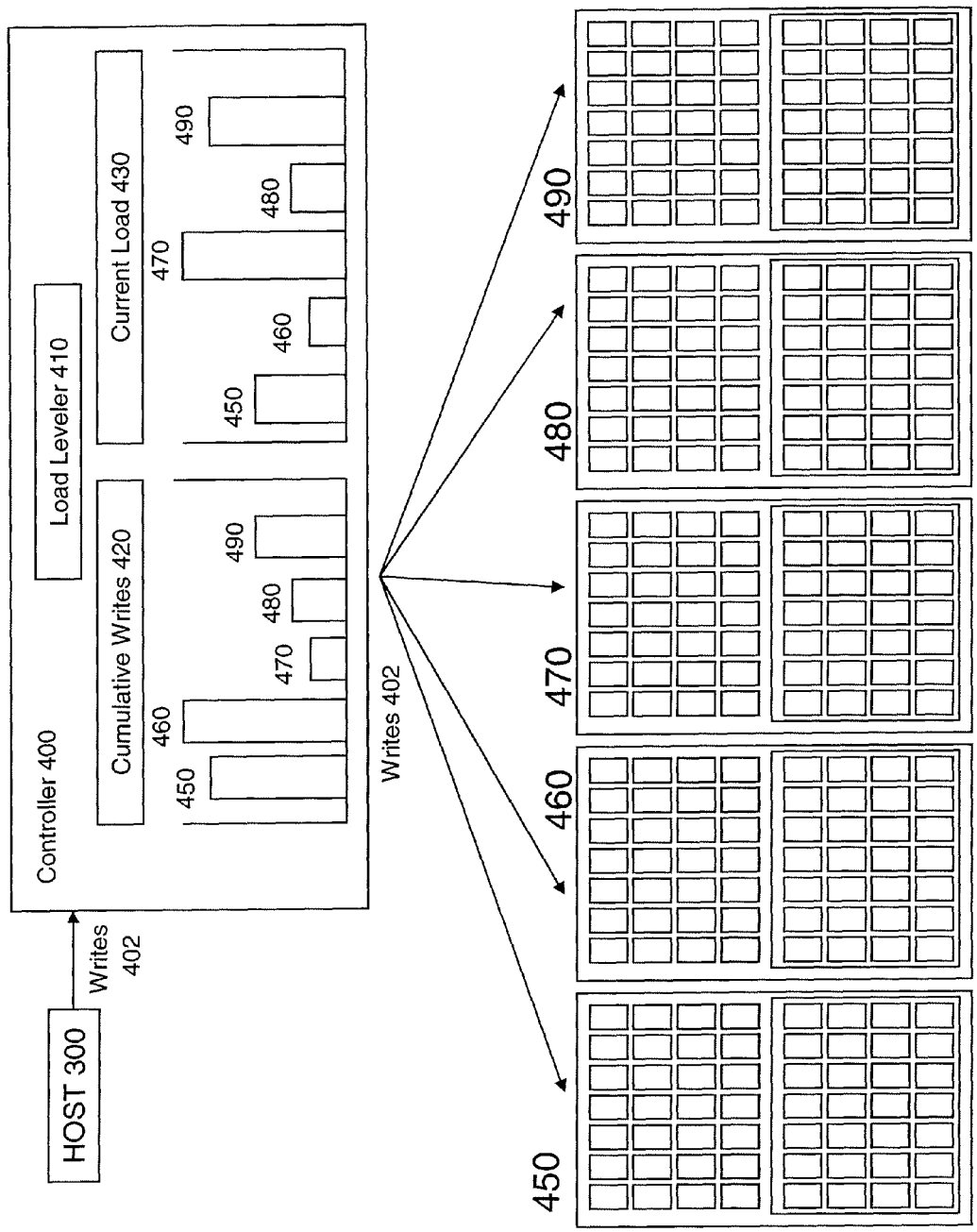
FIG. 4 is a schematic diagram of a number of flash drives that receive balanced writes in accordance with the present invention.

Another technique for utilizing MLC flash memory in an enterprise storage system involves write balancing. As shown in FIG. 4, data writes 402 from a host 300, or from an application running on the host, are written to MLC flash drives 450, 460, 470, 480, and 490 through a controller device 400. Controller 400 includes a load leveler 410 which monitors the cumulative number of writes to each flash drive 450, 460, 470, 480, and 490, as well as the current write load being experienced by each flash drive. Each flash drive 450, 460, 470, 480, and 490 may be configured in a similar manner as flash drive 10 of FIG. 1. Since it is assumed that a drive will wear out after a generally known number of writes, writes 402 are directed to drives 450, 460, 470, 480, and 490 by controller 400 in a manner that evenly spreads writes across the flash drives and balances the load across all of the drives. As generally shown in FIG. 4, flash drive 460 has a greater number of writes than the other drives in the system and flash drive 470 has the fewest. To level the number of writes across all of the drives, the controller 400 reduces further writes 402 from host 300 to drive 460 and increases writes 402 to drive 470, as shown by the current load statistic 430. Managing the number of writes to each particular drive insures efficiency and even wear across each drive in the system, which increases the durability of the entire system.

Figure 5:
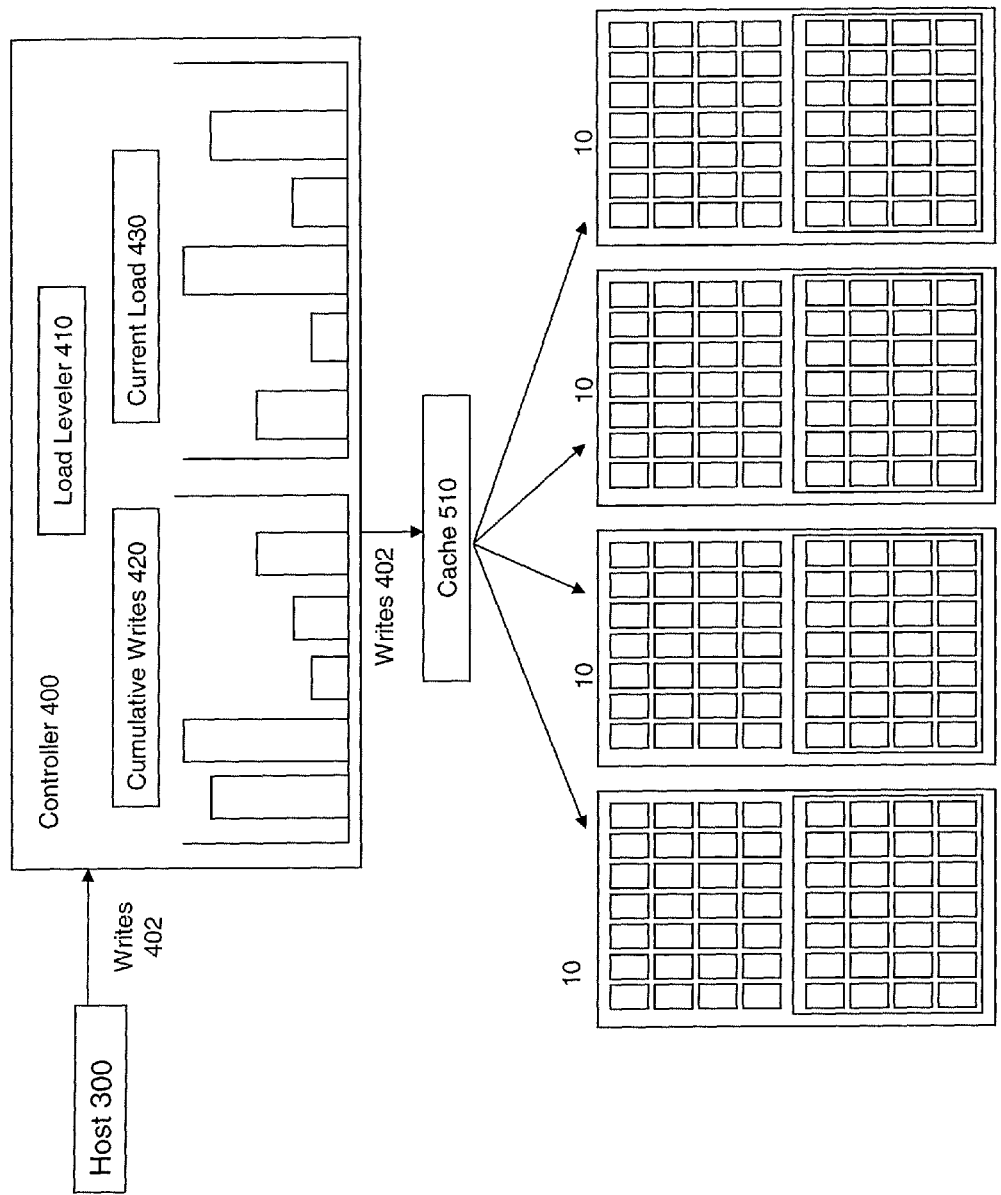
FIG. 5 is a schematic diagram of a number of flash drives that receive cached writes in accordance with the present invention.

Another technique for utilizing MLC flash memory in an enterprise storage system is shown in FIG. 5. Write avoidance involves using cache 510, such as DRAM cache, to absorb and delay writes to the flash drives 10. This is particularly useful in the case of write hits, or writes to recently written data. In other words, data to be written to the flash memory is held in the cache 510 for a period of time before it is written to the drive. If that data is rewritten within the period of time, it is rewritten in the cache. Eventually, the data in the cache is written to one of the flash drives. Since the data was not immediately written to the flash drive on the first write, the number of writes to each drive is reduced, thus increasing the durability of the drives. As shown in FIG. 5, this technique can also be used in combination with the write balancing technique described with respect to FIG. 4.

The design of flash memory divides the total capacity of each chip into units commonly referred to as blocks. These flash blocks are also sub-divided into smaller units called pages. Each flash block will contain something on the order of 128 pages, for example.

When new data is written to the flash chip, a page that has been previously erased is "programmed" to the new value—the restriction is that the programming step can only change the individual bits in one direction; i.e., if the erased state is all '1', then the appropriate bits from the new data pattern will be changed to '0' and the others left alone. Once changed to this new state, they cannot be changed until they are erased again.

One of the optimizations in the design of flash chips is that they only support erasure at the block level (e.g., 128 pages at a time). So when data written to location X is updated, it can't be easily be changed because erasing and reprogramming that location would require copying all the other unchanged pages in the block, erasing the old data, and programming the new data plus the unchanged data back into that block.

This asymmetry in the flash chip architecture has led to the implementation of file system technology to allow new data to be appended to free areas of the flash module more easily, but this comes at a cost—as new data is written, the blocks become fragmented as old data becomes invalidated. Eventually, the file system has to invoke some routines (referred to as housekeeping or garbage collection) that will gather the good data from these fragmented blocks and consolidate it into new blocks to free up the old blocks for new data to be written to. This overhead causes multiple writes to occur within the flash module for each write that the user performs—and so a useful term to describe this overhead is "write amplification", or the ratio of internal writes to external ones.

This amplification of course reduces the life of the module in the same way as any write operations would. The new concept that I describe next seeks to reduce the effect of this write amplification in order to extend the lifetime and reliability of MLC flash modules.

Another characteristic of flash technology is that read operations are much faster than write operations. This characteristic is also part of this new concept:

As described in connection with FIG. 5, a DRAM cache buffer 510 is included between the host/application that is writing data and the flash module (i.e., flash drive) itself. Cache 510 is organized into sectors that contain multiple data elements and is tuned to understand the relative size of the blocks in the flash module, such that the cache sectors are aligned to the flash blocks. Active cache sectors will accumulate writes of new data elements as described before, and when the caching algorithm determines that a cache sector needs to be destaged to the flash module, it will pre-fetch the unchanged data from the target flash block, merge it with the modified data in the cache, and write it back to the module as a complete new flash block. In this manner, the DRAM cache acts to reduce the fragmentation overhead by attempting to write full flash blocks, as well as the previously described technique of buffering rewrites. This greatly reduces the write amplification described above.

Figure 6:
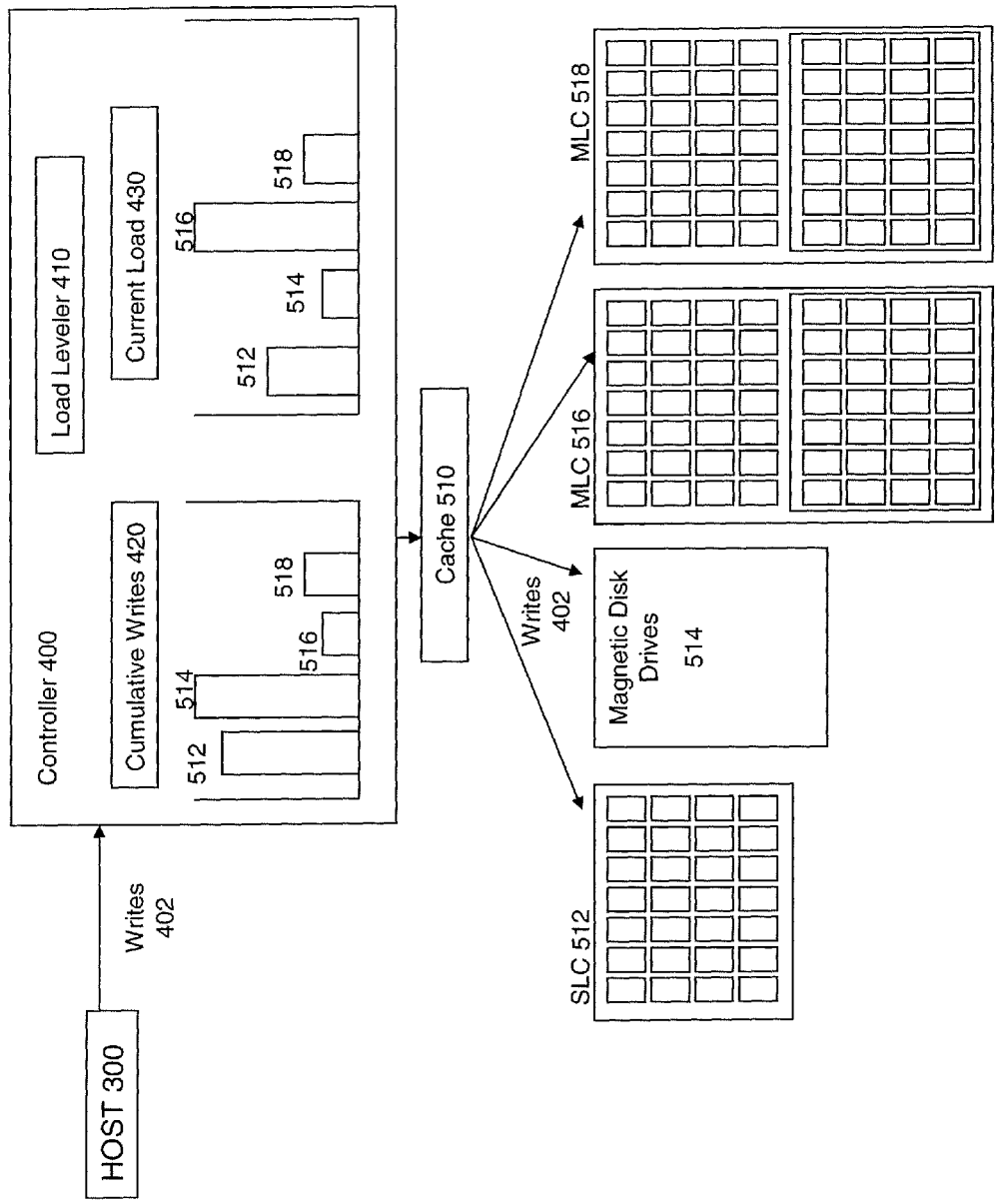
FIG. 6 is a schematic diagram of a number of different-type flash drives and a magnetic disk drive that receive cached writes in accordance with the present invention.

Another technique for utilizing MLC flash memory in an enterprise storage system is shown in FIG. 6. The storage system of this embodiment includes various combinations of MLC flash drives 516, 518, SLC flash drives 512, cache 510, and magnetic disk drives 514. Since historical data usage in a given system is known, decision analysis through statistical tracking and modeling of reads and writes can be done to determine which logical devices enable the system to more advantageously utilize storage components which better suit the particular data being stored. In other words, in such a demand matching technique, data that is known to be frequently-accessed data with very low latency requirements will be written to SLC flash drive 512, while data that is infrequently accessed is written to magnetic disk drives 514. Data having moderate demand is able to be stored in MLC flash drives 516, 518 in accordance with the techniques described above.

Another aspect of this technique involves correlating data sets to age and activity. As data ages, it is typically accessed less often. Data segments within a selected age window are stored on a storage media specific to the age characteristics of the data. Again, newer data written to the storage system may be written to either SLC flash drive 512 while data older than a preset age may be written to magnetic disk drives 514. Data between the age windows of data to be written to SLC drive 512 and magnetic disk drives 514 may be written to MLC flash drives 516, 518. This enables the newer and typically more frequently accessed data to be stored on the storage medium that facilitates quicker reads of the data. It will be understood that the relative age of data will depend on the application and type of data being written and that parameters for age determinations may be set by the user of the system.

In conjunction with this technique, the system can also use the SLC flash drive 512 as a larger level cache to limit writes to the MLC flash drive in a similar manner as the cache 510 was used to limit writes to the MLC memory such as is shown in FIG. 5.

A further embodiment of this technique can be to split data storage between the MLC flash drives and magnetic disk drives. Based on its monitoring of system requests, the system is able to predict that certain data will be needed to be read from memory, and, if the data is stored on the magnetic disk drives, the system can pre-load this data into the cache directly from the magnetic disk drives before it is requested. This predictive technique limits both the response time in accessing the data and the amount of data writes that need to be used to access the data from the MLC flash drive. This enables the system to make the magnetic disk drives appear to the host as MLC flash drives. Further, in periods of lower input/output, the data could be directly written to the magnetic disk drives to avoid writing to the MLC flash memory, thus reducing the number of writes to the MLC flash drives.

Figure 7:
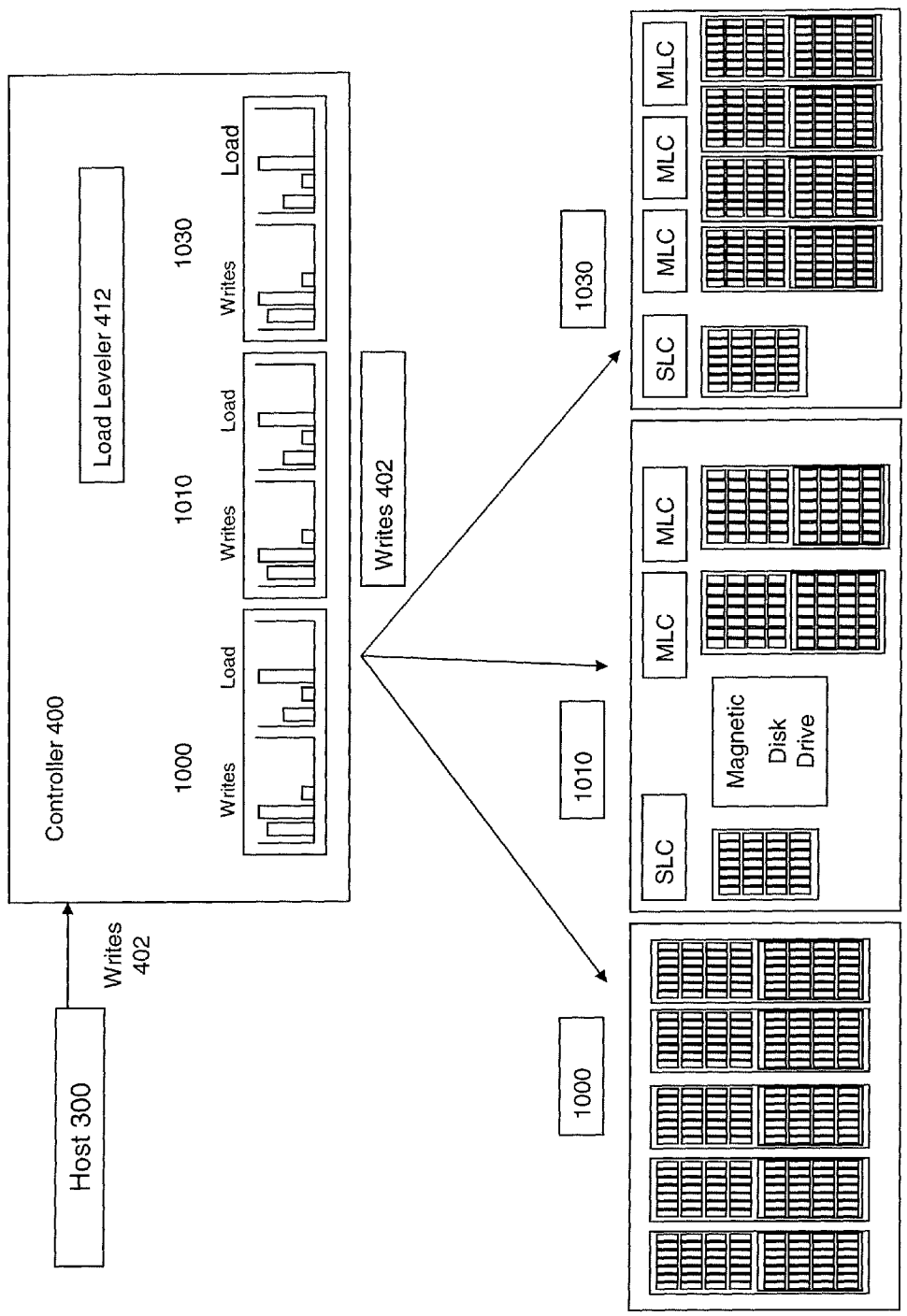
FIG. 7 is a schematic diagram of a plurality of storage systems including various types of storage media in accordance with the present invention.

While the invention has been primarily described at the device level and at the system level, it can also be utilized across multiple systems. As shown in FIG. 7, controller 300 directs data writes 402 from host 300 to each of system 1000, including a plurality of MLC flash drives, system 1010, including SLC, MLC and magnetic disk drives and system 1030, including SLC and MLC flash drives. The controller is able to write data to each of the systems in accordance with each of the techniques described above. Further, each of the techniques described in connection with FIGS. 4-7 may be utilized to write data to each of the chips 12 that make up a drive 10, to each of the chunks 102 that make up virtual disk 100, to each of the storage elements in a RAID group and to each of the storage systems in a multiple-system storage facility. Still further, while, in the figures, groupings of chips 12 in drive 10 and chunks 102 of disk 100 are shown as being physically next to each other in their respective groups, it is understood that the physical location of the chips and chunks with respect to each other is irrelevant to the invention. It is also understood that each grouping of chips and chunks need not be contiguous.

The system and method described herein may find applicability in any computing or processing environment. The system and method may be implemented in hardware, software, or a combination of the two. For example, the system and method may be implemented using circuitry, such as one or more of programmable logic (e.g., an ASIC), logic gates, a processor, and a memory.

The system and method may be implemented in computer programs executing on programmable computers that each includes a processor and a storage medium readable by the processor (including volatile and non-volatile memory and/or storage elements). Each such program may be implemented in a high-level procedural or object-oriented programming language to communicate with a computer system and method. However, the programs can be implemented in assembly or machine language. The language may be a compiled or an interpreted language.

Each computer program may be stored on an article of manufacture, such as a storage medium (e.g., CD-ROM, hard disk, or magnetic diskette) or device (e.g., computer peripheral), that is readable by a general or special purpose programmable computer for configuring and operating the computer when the storage medium or device is read by the computer to perform the functions of the data framer interface. The system and method also may be implemented as a machine-readable storage medium, configured with a computer program, where, upon execution, instructions in the computer program cause a machine to operate to perform the functions of the system and method described above.

Implementations of the system and method may be used in a variety of applications. Although the system and method is not limited in this respect, the system and method may be implemented with memory devices in microcontrollers, general-purpose microprocessors, digital signal processors (DSPs), reduced instruction-set computing (RISC), and complex instruction-set computing (CISC), among other electronic components.

Implementations of the system and method may also use integrated circuit blocks referred to as main memory, cache memory, or other types of memory that store electronic instructions to be executed by a microprocessor or store data that may be used in arithmetic operations.

The system may be embodied in other specific forms without departing from the spirit or essential characteristics thereof. The present embodiments are therefore to be considered in respects as illustrative and not restrictive, the scope thereof being indicated by the appended claims rather than by the foregoing description, and all changes which come within the meaning and range of the equivalency of the claims are therefore intended to be embraced therein.

The invention claimed is:

1. A data storage system comprising:
   a host;
   a controller; and
   a data storage drive comprising:
      a plurality of flash memory elements;
      a first memory portion including a first number of the flash memory elements; and
      a second memory portion including a second number of the flash memory elements, the second memory portion being exclusive of the first memory portion;
   wherein the first memory portion and the second memory portion combine to represent an actual capacity of the data storage drive and the first memory portion represents an advertised capacity of the data storage drive, the advertised capacity of the first memory portion being presented to the host by the controller as a total capacity of the data storage drive; and wherein data writes from the host to the data storage drive are written to a capacity of flash memory elements corresponding to the advertised capacity, but wherein data writes are spread over the actual capacity of the data storage drive.

2. The system of claim 1 wherein data storage drive is a flash drive and the flash memory elements comprise MLC (multi-level cell) flash memory chips.

3. The system of claim 1 wherein data storage drive is a virtual disk and the flash memory elements comprise flash drive chunks, each including a number of MLC flash memory chips.

4. The system of claim 1 wherein data storage drive is a RAID (Redundant Array of Inexpensive Disks)-configured drive array and the flash memory elements comprise flash drive chunks, each including a number of MLC flash memory chips.

5. The system of claim 1 wherein the controller further includes a load balancer device configured to monitor a cumulative number of data writes from the host to each of the flash memory elements and to direct data writes to flash memory elements having fewer data writes compared to other flash memory elements in the system.

6. The system of claim 1 further including a cache memory device configured to temporarily store data writes from the host to the data storage drive, wherein a data write is temporarily stored in the cache for a period of time and, if the data write is rewritten during the period of time, it is rewritten in the cache memory device.

7. A method of increasing the durability of a data storage system including a plurality of MLC (multi-level cell) flash drives comprising:

overprovisioning a data storage drive comprising a plurality of MLC flash memory devices by forming a first memory portion including a first number of the MLC flash memory devices and a second memory portion including a second number of the MLC flash memory devices, the second memory portion being exclusive of the first memory portion;

wherein the first memory portion and the second memory portion combine to represent an actual capacity of the data storage drive and the first memory portion represents an advertised capacity of the data storage drive;

presenting the advertised capacity of the first memory portion being to a host by a controller as a total capacity of the data storage drive;

writing an amount of data writes from the host to flash memory devices of the data storage drive corresponding to the advertised capacity; and spreading the data writes over the flash memory devices of the data storage drive corresponding to the actual capacity of the data storage drive.

8. The method of claim 7 further comprising monitoring a cumulative number of data writes from the host to each of the flash memory devices and to directing data writes to flash memory devices having fewer data writes compared to other flash memory devices in the system.

9. The method of claim 7 further comprising temporarily storing, in cache, data writes from the host to the data storage drive, wherein a data write is temporarily stored in the cache for a period of time and, if the data write is rewritten during the period of time, it is rewritten in the cache memory device; and writing the data write to the data storage drive upon an expiration of the period of time.

10. The method of claim 7 further comprising monitoring an age of data being written to the data storage drive and writing newer data to flash memory devices of the data storage drive and writing older data to magnetic drives of the data storage drive.

11. The method of claim 7 further comprising monitoring a demand associated with data being written to the data storage drive and writing high-demand data to flash memory devices of the data storage drive and writing low-demand data to magnetic drives of the data storage drive.

* * * * *